United States Patent
Park et al.

(10) Patent No.: US 7,411,529 B2
(45) Date of Patent: Aug. 12, 2008

(54) METHOD OF DECODING BIN VALUES USING PIPELINE ARCHITECTURE AND DECODING DEVICE THEREFOR

(75) Inventors: In-cheol Park, Daejon (KR); Yong-seok Yi, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/601,653

(22) Filed: Nov. 20, 2006

(65) Prior Publication Data

US 2007/0115154 A1    May 24, 2007

(30) Foreign Application Priority Data

Nov. 18, 2005  (KR) .................... 10-2005-0110901

(51) Int. Cl.
    *H03M 7/00*    (2006.01)
(52) U.S. Cl. .................... 341/107; 341/50; 341/106
(58) Field of Classification Search ............ 341/50, 341/106, 107
    See application file for complete search history.

(56) References Cited

U.S. PATENT DOCUMENTS

| | | | |
|---|---|---|---|
| 6,215,906 B1 | 4/2001 | Okada | |
| 6,900,748 B2 * | 5/2005 | Marpe et al. | 341/107 |
| 7,088,272 B2 * | 8/2006 | Nomura | 341/107 |
| 2007/0030180 A1 * | 2/2007 | Yang et al. | 341/50 |
| 2007/0080832 A1 * | 4/2007 | Yang et al. | 341/50 |
| 2007/0183491 A1 * | 8/2007 | Pearson et al. | 375/240 |

FOREIGN PATENT DOCUMENTS

| | | |
|---|---|---|
| JP | 2001-136524 A | 5/2001 |
| JP | 2002-33925 A | 1/2002 |
| JP | 2003-209699 A | 7/2003 |
| KR | 2001-0023914 A | 3/2001 |
| KR | 10-2004-0050754 A | 6/2004 |
| KR | 10-2005-0021233 A | 3/2005 |
| KR | 10-2005-0064117 A | 6/2005 |

* cited by examiner

*Primary Examiner*—Peguy JeanPierre
(74) *Attorney, Agent, or Firm*—Sughrue Mion, PLLC

(57) ABSTRACT

A method and device for decoding bin values using a pipeline architecture in a CABAC decoder are provided. The method includes reading a first context model required to decode a first bin value, from a memory; determining whether a second context model required to decode a second bin value is the same as the first context model, while decoding the first bin value using the first context model; determining whether a third context model required to decode a third bin value is the same as the second context model, while decoding the second bin value using the second context model, if it is determined that the second context model is the same as the first context model; and reading the second context model from the memory, if it is determined that the second context model is not the same as the first context model.

23 Claims, 6 Drawing Sheets

| Test Sequence | | | No pipeline (cycles) | Pipeline (cycles) | Improvement (%) |
|---|---|---|---|---|---|
| Name | Number of Frames | Frame Size | | | |
| salesman | 81 | 176x144 | 2,839,734 | 2,619,466 | 7.8 |
| foreman | 199 | 176x144 | 4,706,017 | 4,201,305 | 10.7 |
| silent | 59 | 176x144 | 2,014,079 | 1,839,571 | 8.7 |
| | | | | Average | 9.1 |

METHOD OF DECODING BIN VALUES USING PIPELINE ARCHITECTURE AND DECODING DEVICE THEREFOR

CROSS-REFERENCE TO RELATED PATENT APPLICATION

This application claims priority from Korean Patent Application No. 10-2005-0110901, filed on Nov. 18, 2005, in the Korean Intellectual Property Office, the disclosure of which is incorporated herein in its entirety by reference.

BACKGROUND OF THE INVENTION

1. Field of the Invention

Methods and apparatuses consistent with the present invention relate to CABAC decoding, and more particularly, to decoding a plurality of bin values using a pipeline architecture in a CABAC decoder, and a decoding device therefor.

2. Description of the Related Art

Context-based adaptive binary arithmetic coding (CABAC) is an entropy coding method used in a main profile of H.264/AVC. In CABAC, each symbol is dynamically coded using statistical features to update its relative probability, thereby improving compression efficiency.

CABAC decoding is the process of sequentially decoding a plurality of binary values (0 or 1), or "bins", from a syntax element (SE) which is encoded by a CABAC encoder. To decode each bin, several unit operations are required, including a context selection operation, a context model loading operation, a binary arithmetic decoding operation, a binarization matching operation, and a context model update operation. The unit operations may each require one cycle.

If each bin is decoded after its previous bin is decoded, then since five cycles are required to decode each bin, 5 n cycles are required to decode n bins. For this reason, real time decoding is impossible in practice when a display device has a standard definition (SD) or larger screen size. Therefore, parallel processing is necessary in this case, in which a plurality of bins are processed at once using a pipeline architecture.

SUMMARY OF THE INVENTION

The present invention provides a method of decoding a plurality of bin values in a CABAC decoder using a pipeline architecture.

The present invention also provides a decoding device for performing the above method.

The present invention also provides a computer-readable medium having embodied thereon a computer program for executing the above method.

According to an aspect of the present invention, there is provided a method of decoding a plurality of bin values using a pipeline architecture, comprising: reading a first context model required to decode a first bin value, from a memory; determining whether a second context model required to decode a second bin value is the same as the first context model, while decoding the first bin value using the first context model; determining whether a third context model required to decode a third bin value is the same as the second context model, while decoding the second bin value using the second context model, if the second context model is the same as the first context model; and reading the second context model from the memory if the second context model is not the same as the first context model.

According to another aspect of the present invention, there is provided a method of decoding a plurality of bin values in a CABAC decoder using a pipeline architecture, comprising: determining whether a first context model read from a memory is the same as a second context model required to decode an (i)th bin value, where i is a positive integer; determining whether a third context model required to decode an (i+1)th bin value is the same as the second context model while decoding the (i)th bin value by using the second context model, if the first context model is the same as the second context model; and reading the second context model from the memory if the first context model is not the same as the second context model.

According to another aspect of the present invention, there is provided a device for decoding a plurality of bin values using a pipeline architecture, comprising: a context model loading unit which reads a first context model required to decode one bin value; a decoding and context model equality determining unit which determines whether a second context model required to decode the next bin value in a pipeline is the same as the first context model, while decoding the one bin value using the first context model; and a pipeline control unit which operates the decoding and context model equality determining unit by considering the next bin value in the pipeline to be a current bin value in the pipeline if the second context model is the same as the first context model, and operates the context model loading unit by considering the next bin value in the pipeline to be the current bin value in the pipeline if the second context model is not the same as the first context model.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

A method and device for decoding a plurality of bin values using a pipeline architecture in a CABAC decoder will now be described in detail by explaining exemplary embodiments of the invention with reference to the attached drawings.

Figure 1:
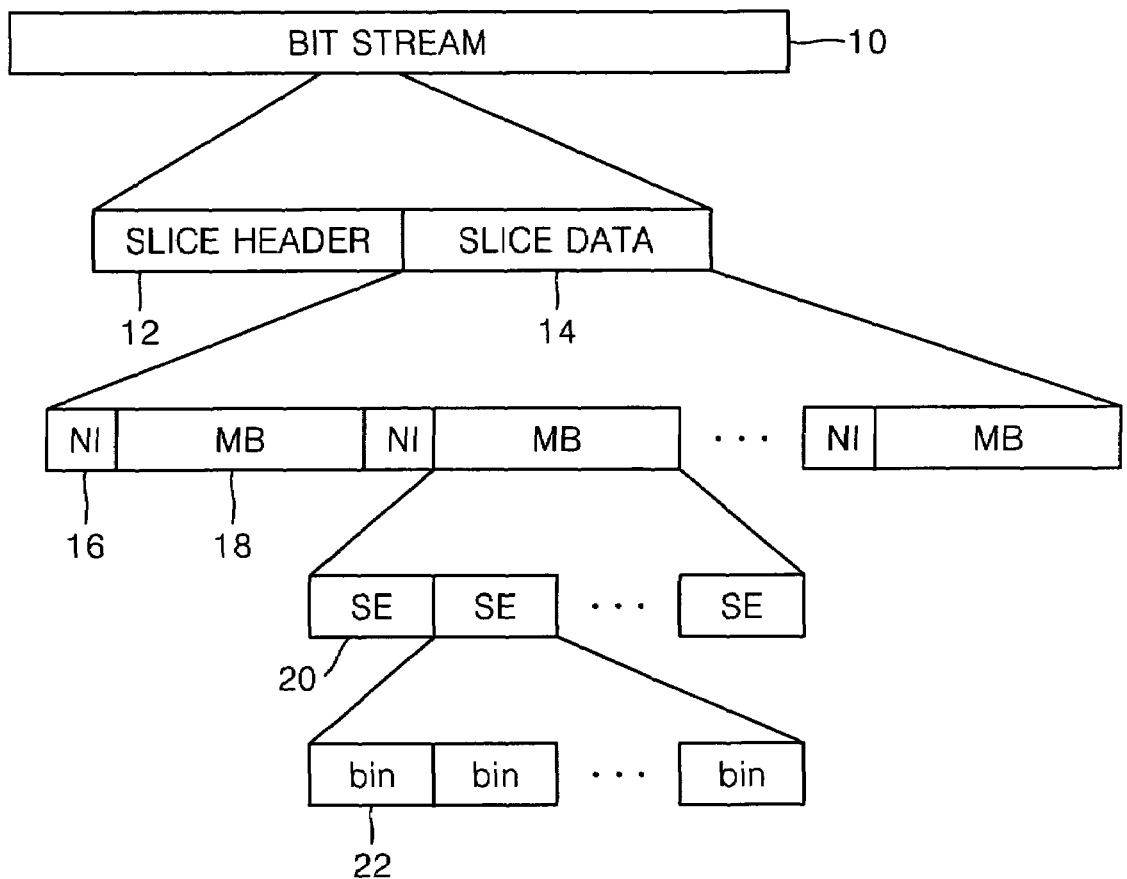
FIG. 1 shows a hierarchical structure of H.264/AVC decoding.

FIG. 1 shows a hierarchical structure of H.264/AVC decoding.

Referring to FIG. 1, a bit stream 10 of H.264/AVC consists of a set of syntax elements (SE) 20, similar to that of other moving picture compression standards.

The bit stream 10 includes one or more slices. The slices each consist of a slice header 12 and slice data 14.

The slice data 14 includes one or more macro blocks (MB) 18. The MB 18 includes a neighbor identifier NI 16 which borders neighboring MBs. Data of the neighboring MBs are used when a context selection is performed for the SEs 20 in the current MB 18.

The MB 18 includes one or more SEs 20. The SE 20 consists of a bin string including a plurality of bins 22.

Figure 2:
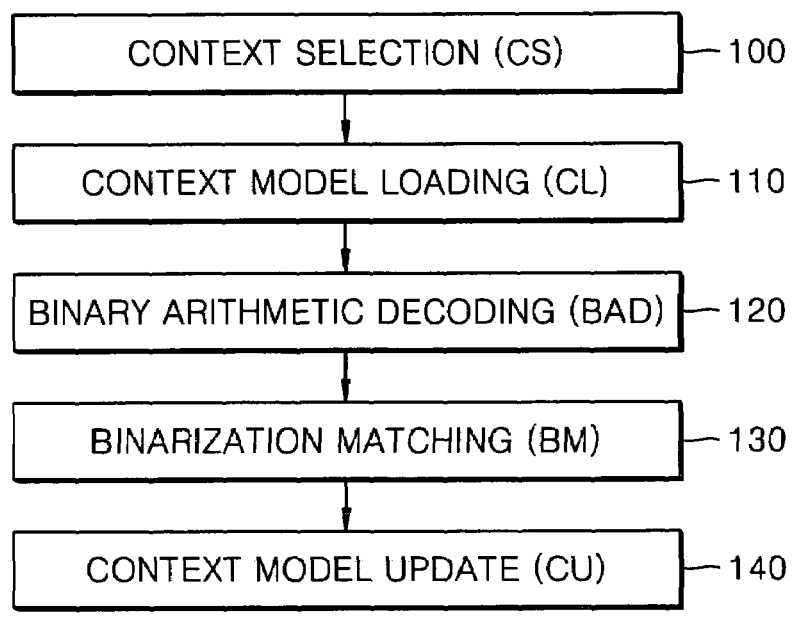
FIG. 2 shows unit operations for decoding one bin.

FIG. 2 shows unit operations for decoding one bin 22. Referring to FIG. 2, the unit operations of a context selection (CS) operation 100, a context model loading (CL) operation 110, a binary arithmetic decoding (BAD) operation 120, a binarization matching (BM) operation 130, and a context model update (CU) operation 140 are performed to decode each bin.

In the CS operation 100, context models required to decode the bin are selected. In the CL operation 110, the selected context models are read. In the BAD operation 120, a bin value is generated. In the BM operation 130, it is checked whether the generated bin value constitutes a valid bin string. In the BAD 120 operation, a current context model value may be modified according to the generated bin value. In the CU operation 140, if the context model value is modified in the BAD 120 operation, the modified value is stored in a memory.

In general, the compression efficiency of H.264/AVC depends on the CABAC. Thus, to obtain better compression efficiency, the CABAC decoding has to be performed more effectively. The CABAC decoding is the process of sequentially decoding a plurality of binary values (0 or 1), or "bins". To decode each bin, several unit operations are sequentially performed. Since the operations have data dependency with each other due to their algorithms, it is difficult to decode each bin through parallel processing. Also, a structural hazard makes it difficult to use a pipeline architecture. In the present invention, the unit operations are modified to provide a method and device for decoding a plurality of bin values using a pipeline architecture in the CABAC decoder.

Figure 3:
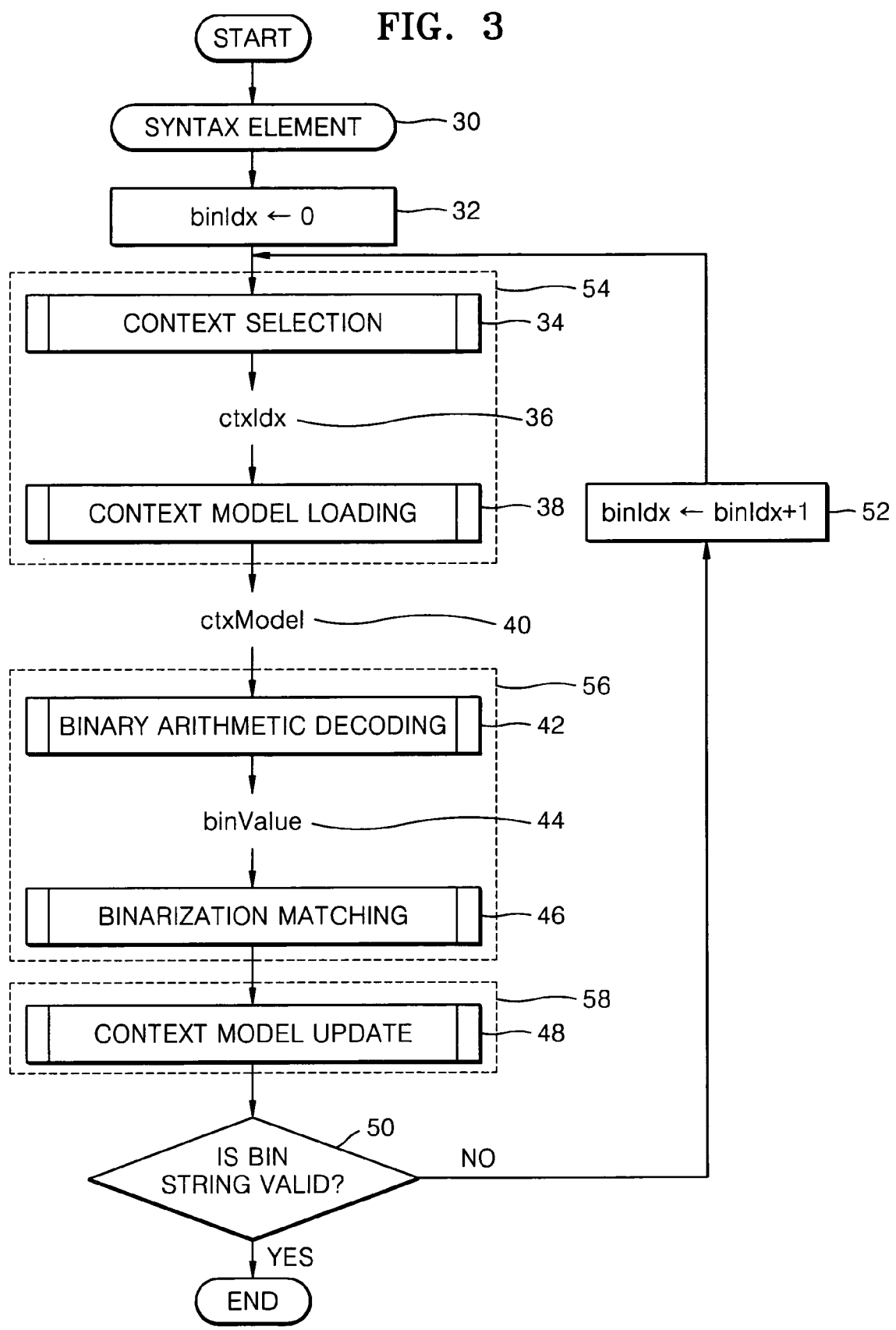
FIG. 3 is a flowchart illustrating each unit operation and its result in the process of decoding one syntax element.

FIG. 3 is a flowchart illustrating each unit operation and its result in the process of decoding one SE.

The value of the SE is converted into a variable length code (VLC) through binarization. The binarization may be unary binarization, truncated unary binarization, unary/k-th order Exp-Golomb binarization, fixed length binarization, or binarization for a specific SE. The binarization is chosen by taking features of each SE into account, so that the average length of the arithmetic coded bin strings can be minimized.

A bin string including one or more bins is obtained when VLC is performed. The bin string is encoded using CABAC. Thus, when the SE is decoded using CABAC, the bin string can be obtained as a result. Each bin has a value of 0 or 1. The bin value which has a higher probability of occurrence in all of the SEs is referred to as the most probable symbol (MPS), and the bin value which has a lower probability of occurrence in all of the SEs is referred to as the least probable symbol (LPS). The probability of occurrence of the MPS in all of the SEs is referred to as the symbol probability. The symbol probability can be any value in the range of 0 to 1. However, the symbol probability is represented finitely through quantization, since the CABAC decoder cannot provide infinite precision. Therefore, the symbol probability is represented by a six-bit probability state index.

Bins of each SE have different statistical features, such as the probability state index and the MPS. The statistical feature of the bins is referred to as a context. Each SE has one or more contexts, and each context has the probability state index and the MPS. By combining the six-bit probability state index with the one-bit MPS of each context, a seven-bit context model is obtained. There are as many as 399 context models exist in the H.264/AVC main profile.

To decode one SE 20, each bin 22 corresponding to the SE 20 is sequentially decoded. First, it is determined which SE 20 will be decoded (operation 30). Then, a bin index (binIdx) is set to 0 to decode the first bin of the SE 20 (operation 32).

To decode each bin 22 corresponding to the SE 20, the context corresponding to the bins 22 has to be known. A context selection (CS) operation 34 is the process of selecting the context corresponding to the bins 22. In general, the first bin of the SE 20 corresponds to one context among a maximum of four contexts. The context is indexed by a context index (ctxIdx) 36. The ctxIdx 36 is represented by the sum of a context index offset (ctxIdxOffset) and a context index increment (ctxIdxInc). The ctxIdxOffset is inherently defined according to the type of SE 20. The ctxIdxInc is obtained in the CS operation 34.

If the ctxIdxInc obtained in the operation 34 is added to the ctxIdxOffset, the ctxIdx 36 is obtained. The ctxIdx 36 is converted into the address of the context model, and a context model (ctxModel) 40 is read from the memory to decode the current bin using the address. This is referred to as a context model loading (CL) operation 38.

To use the pipeline architecture, the CS operation 34 and the CL operation 38 can be performed through parallel processing. For this, context models corresponding to the SE to be decoded using the ctxIdxOffset have to be concurrently read from the memory. The context models concurrently read from the memory are referred to as candidate context models.

The ctxIdxInc is estimated for the SE to be decoded while the candidate context models are read from the memory, and then context models corresponding to the estimated ctxIdxInc are selected from among the read candidate context models.

Through this parallel processing, the CS operation 34 and the CL operation 38 can be performed in one cycle.

A BAD operation 42 is performed by using the read ctxModel 40. A bin value (binValue) 44 is determined in the BAD operation 42. The ctxModel 40 includes the six-bit probability state index and the one-bit MPS value. The probability state index is used to read the symbol probability, that is, the probability of the MPS stored in the decoder. The read symbol probability is used to update the coding range which is an internal value of the decoder. The updated coding range is compared with a coding offset which is a part of the bit stream. If the coding offset is less than the coding range, the binValue 44 becomes the MPS, and if the coding offset is greater than or equal to the coding range, the binValue 44 becomes the LPS.

As a result of the BAD operation 42, a bin string is obtained in which the value of the SE, rather than the SE itself, is binarized. Once the BAD operation 42 is performed, a one-bit bin value is generated. The generated bin value is added to the bin string generated in the previous operation to generate a new bin string.

The current bin string has to be valid in order to complete the decoding process for the SE. When the bin string can be generated through binarization, the bin string is considered to be valid.

When one bin is output after the BAD operation 42, it is checked whether the current bin string is valid in a BM operation 46. If it is determined that the current bin string is valid in the BM operation 46 (operation 50), a de-binarization operation is performed to generate the value of the SE.

If it is determined that the bin string is invalid (operation 50), the decoding process is performed for the next bin. At this time, a bin index (binIdx) is increased by 1 (operation 52), and then the aforementioned operations operation 34 through operation 50 are repeated.

The BAD operation 42 and the BM operation 46 may be parallel processed using the pipeline architecture. For this, while the BAD operation 42 is performed, a bin value to be generated is pre-estimated, which makes the bin string including the generated bin value valid. The bin value to make the bin string valid is referred to as an expected bin value. When the BAD operation 42 is complete and thus the bin value is generated, the BM operation 46 is performed by comparing the generated bin value with the expected bin value. The comparison of the generated bin value and the expected bin value may be performed by using an exclusive NOR operator.

As a result, the BAD operation 42 and the BM operation 46 can be performed in one cycle through parallel processing.

The context model value may be modified in the process of performing the BAD operation 42. Since the context model value may be used to decode another bin, the context model value has to be updated in a context model memory. This is referred to as a CU operation 48.

As described above, to decode one bin, five operations are required: the CS operation 34, the CL operation 38, the BAD operation 42, the BM operation 46, and the CU operation 48. Among the five operations, the CS operation 34 and the CL operation 38 can be performed in one cycle through parallel processing (operation 54), and the BAD operation 42 and the BM operation 46 can be performed in one cycle through parallel processing (operation 56). To perform the CU operation 48, one further cycle is required (operation 58). Thus, when parallel processing is used for each bin, three cycles of processing time, that is, latency, are required to decode one bin.

The context model memory is accessed in the CL operation 38 and the CU operation 48. If the CL operation 38 is performed for one bin while the CU operation 48 is performed for another bin, the two operations cannot be performed properly. This is referred to as a structural hazard, and occurs when a memory is concurrently accessed by two different operations. The structural hazard makes it difficult to use the pipeline architecture for decoding each bin.

Thus, to decode each bin by using the pipeline architecture, the structural hazard has to be prevented. To this end, the CL operation 38 and the CU operation 48 have to be removed from an operation chain that is performed in the order of the CS operation 34, the CL operation 38, the BAD operation 42, the BM operation 46, and the CU operation 48.

When the CS operation 34 and the CL operation 38 are parallel processed, a context model reservoir (CMR) is used, in which several context models are read from the memory and temporarily stored. The decoding device of the present invention uses the CMR to remove the CL operation 38 and the CU operation 48 from the operation chain.

Namely, the context models stored in the CMR by the CL operation 38 to decode one bin are continuously stored in the CMR and then transferred to a decoding unit, until it is determined in the CS operation 34 that a new context model has to be read from the memory. This removes the CL operation 38 from the operation chain.

Also, the context models to be updated are temporarily stored in the CMR, and when the context models are no longer used (when the decoding process for the SE is complete or when the result of the CS operation 34 indicates that the required context model does not exist in the context models stored in the current CMR), the context models stored in the CMR are concurrently stored in the context memory. This removes the CU operation 48 from the operation chain, thereby preventing the structural hazard. Further, the BAD operation 42 and the BM operation 46 to decode the bin of which binIdx is i, and the CS operation 34 to decode the bin of which binIdx is i+1 can be performed in the same cycle, which makes it possible to use a pipeline operation.

If the result of the CS operation 34 indicates that the required context model does not exist in the context models stored in the current CMR, the CL operation 38 and the CU operation 48 have to be performed. In this case, since one cycle is required for each operation, the overall pipeline operation is delayed, which is referred to as a stall.

Besides the stall caused by the CL operation 38 and the CU operation 48, a stall may also be caused by the data dependency or when a bit stream buffer (BSB) for storing a codeword required for the BAD operation 42 is empty. For better pipeline operation, these stalls have to be prevented.

The stall caused by the data dependency occurs when the value obtained from the BAD operation 42 for the bin of which binIdx is i, that is, the decoded bin value, is used in the CS operation 34 for the bin of which binIdx is i+1 or i+2. When these stalls occur, it is difficult to perform the BAD operation 42 and the BM operation 46 for the bin of which binIdx is i and the CS operation 34 for the bin of which binIdx is i+1 or i+2 in the same cycle.

To solve this problem, the present invention uses data forwarding. The data forwarding operates as follows. First, in the CS operation 34 for the bin of which binIdx is i+1 or i+2, context index increments are respectively estimated for the case when the decoded value of the bin of which binIdx is i is 0, and for the case when the decoded value of the bin of which binIdx is i is 1. Then, if the bin of which binIdx is i is decoded and its result comes out in the same cycle, one of the two context index increments are selected. This can be simply implemented by using a 2:1 multiplexer. Accordingly, the stall caused by the data dependency can be prevented by the data forwarding.

Meanwhile, there is no way to prevent the stall occurring when the BSB is empty. Thus, three cycles are unnecessarily consumed.

Figure 4:
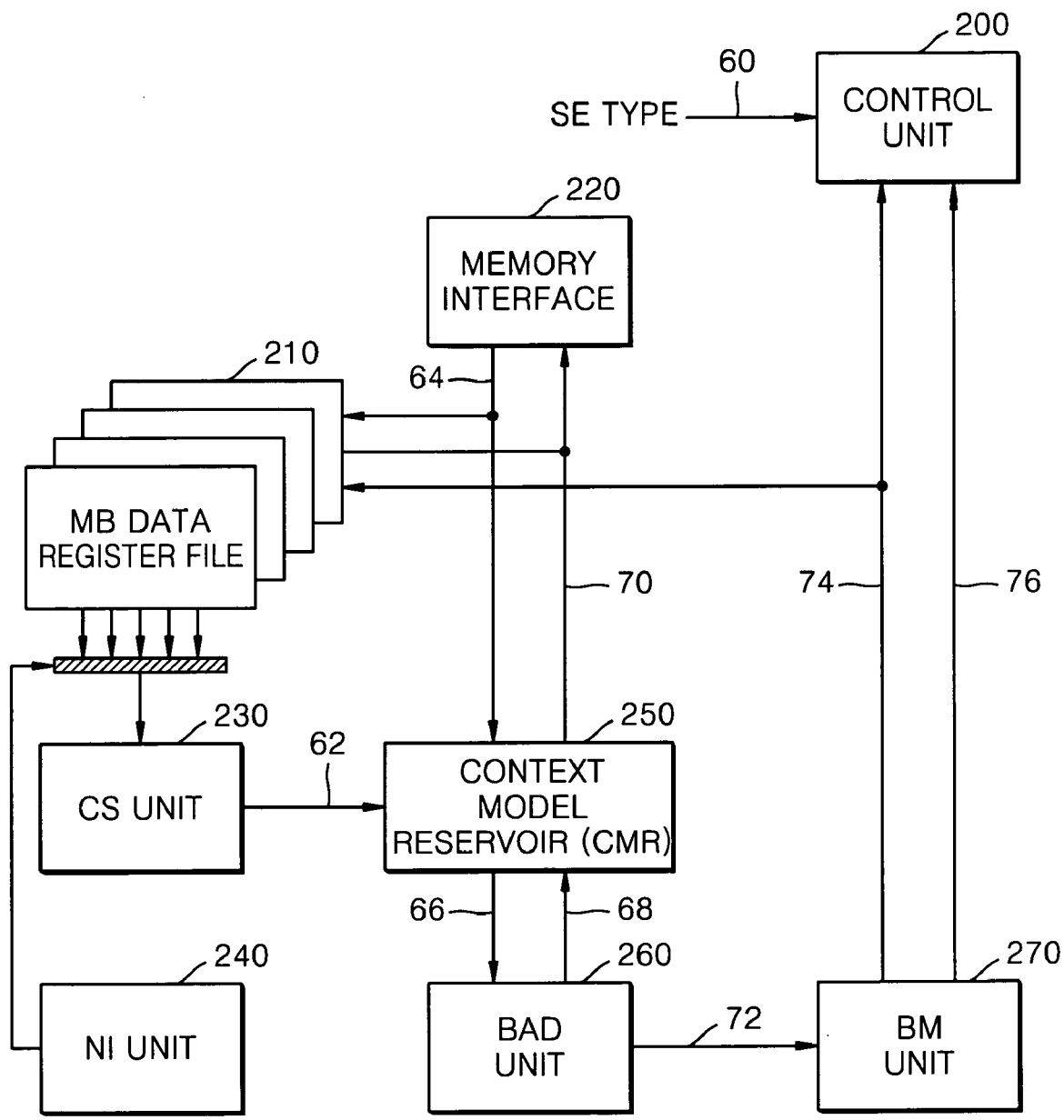
FIG. 4 is a block diagram of a decoding device for decoding a syntax element according to an exemplary embodiment of the present invention.

FIG. 4 is a block diagram of a decoding device for a SE according to an exemplary embodiment of the present invention. Referring to FIG. 4, the decoding device includes a control unit 200, a macro block (MB) data register file 210, a memory interface 220, a context selection (CS) unit 230, a neighbor identification (NI) unit 240, a context model reservoir (CMR) 250, a binary arithmetic decoding (BAD) unit 260, and a binarization matching (BM) unit 270.

The control unit 200 controls the operation of each unit according to each type (SE Type) 60 of SEs externally input to the control unit 200. Control signals for each unit are not shown in FIG. 4.

The MB data register file 210 stores data of the current MB and data of MBs neighboring the current MB, among previously performed MBs. This is because the data of neighboring MBs has to be referred to in some cases for the context selection. The MB data is updated through the memory interface 220.

The CS unit 230 performs the context selection by referring to the data stored in the MB data register file 210.

When the CS unit 230 refers to the NI unit 240, the NI unit 240 selects an MB.

The CMR 250 reads and stores candidate context models.

The BAD unit 260 performs a binary arithmetic decoding operation by using a context model 66 selected by the CS unit 230 from among the candidate context models stored in the CMR 250, to generate a one-bit binary value, that is, a bin value 72. Further, the BAD unit 260 can modify the value of the context model used to decode each bin. The context model 68 of which value is modified is temporarily stored in the CMR unit 250, and is stored in the memory in the CU operation 48.

The BAD unit 270 uses the bin value 72 to perform the BM operation 46. According to the result of the BM operation 46, if it is determined that the current bin string is valid, a valid signal 76 has the value of 1. When the valid signal 76 is 1, after receiving the valid signal 76, the control unit 200 controls other units to decode the next SE.

Further, the BAD unit 270 generates the value 74 of the decoded SE to be transferred to the MB data register file 210.

Figure 5:
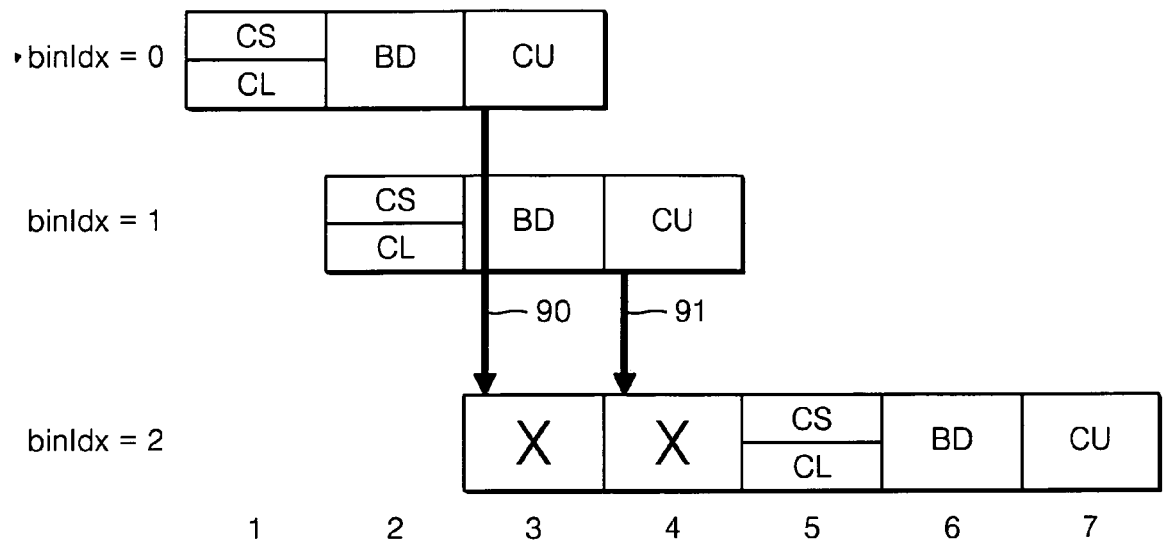
FIG. 5 shows how a pipeline operates when a stall occurs in the case of not using a pipeline architecture, according to an exemplary embodiment of the present invention.

FIG. 5 shows how a pipeline operates when a stall occurs in the case of not using a pipeline architecture, according to an exemplary embodiment of the present invention. Referring to FIG. 5, a decoding pipeline is shown for the first to third bins.

The aforementioned CS and CL operations can be performed in the same cycle through parallel processing. Further, the BAD and BM operations can be performed in the same cycle through parallel processing. In FIG. 5, the BAD and BM operations are indicated by a binary arithmetic decoding and binarization matching (BD) operation.

In the first cycle, the CS and CL operations are performed for the first bin (binIdx=0).

In the second cycle, the BD is performed while the CS and CL operations are performed for the second bin (binIdx=1).

In the third cycle, the CU operation for the first bin and the BD operation for the second bin are performed at the same time. The CS and CL operations cannot be performed for the third bin (binIdx=2) in the third cycle, since a structural hazard 90 occurs due to the CU operation for the first bin. Thus, the decoding process is complete for the first bin in the third cycle.

In the fourth cycle, the CU operation for the second bin is performed. The CS and CL operations cannot be performed for the third bin in the fourth cycle, since a structural hazard 91 occurs due to the CU operation for the second bin. Thus, the decoding process is complete for the second bin in the fourth cycle.

In the fifth to seventh cycles, the CS, CL, BD, and CU operations are respectively performed for the third bin. Thus, the decoding process is complete for the third bin the seventh cycle.

If the structural hazard 90 caused by the CU operation for the first and second bins and the structural hazard 91 caused by the CL operation for the third bin do not occur, the two-cycle stall is not generated, thereby reducing latency for the overall decoding process.

Figure 6:
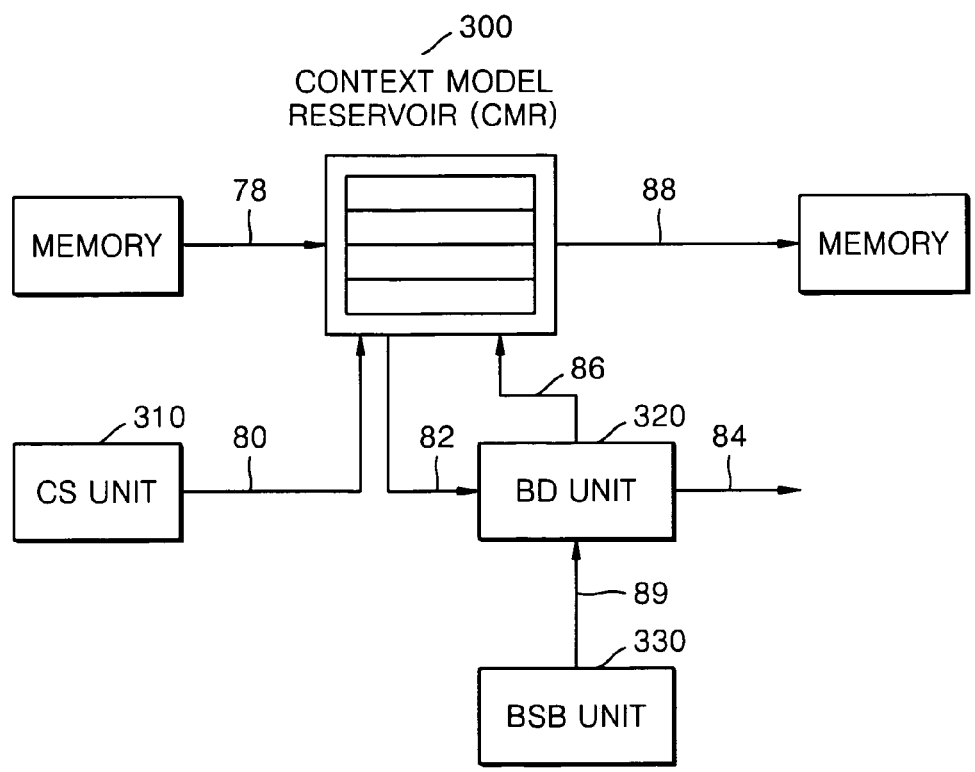
FIG. 6 is a block diagram of a decoding device for bin values using the pipeline architecture, according to an exemplary embodiment of the present invention.

FIG. 6 is a block diagram of a decoding device for bin values using the pipeline architecture, according to an exemplary embodiment of the present invention. Referring to FIG. 6, the decoding device includes a CMR 300, a CS unit 310, a BD unit 320, a bit stream buffer (BSB) unit 330, and a control unit (not shown) for controlling a pipeline operation.

The CMR 300 reads candidate context models 78, which correspond to a SE including a current bin value to be decoded, from a memory. In the same cycle, the CS unit 310 estimates a context index increment 80 for the SE including the current bin value. The CMR 300 uses the context index increment 80 to select a context model 82 from among the candidate context models 78 to decode the current bin value.

The BD unit 320 uses the selected context model 82 to perform the BD operation for the current bin value. When decoding is complete for one SE and a valid bin sting is generated, the BD unit 320 performs a de-binarization operation for the bin string and outputs the decoded SE 84. Further, the BD unit 320 modifies the value of the context models 86 in the BAD operation, and transfers the value to the CMR 300.

The CMR 300 stores the modified context models 86. When the current context models are no longer used, for example, if new context models are read from the memory, the CMR 300 stores the modified context models 88 in the memory.

While the BD unit 320 decodes one bin, the CS unit 310 estimates a context index for a SE including the next bin to determine a context model required to decode the next bin value in the pipeline.

If the estimated context index is the same as the context index of the context model used to decode the current bin value, it means that the context model required to decode the next bin value is already stored in the CMR 300. In this case, since the CL operation is not required, the stall does not occur.

Figure 7:
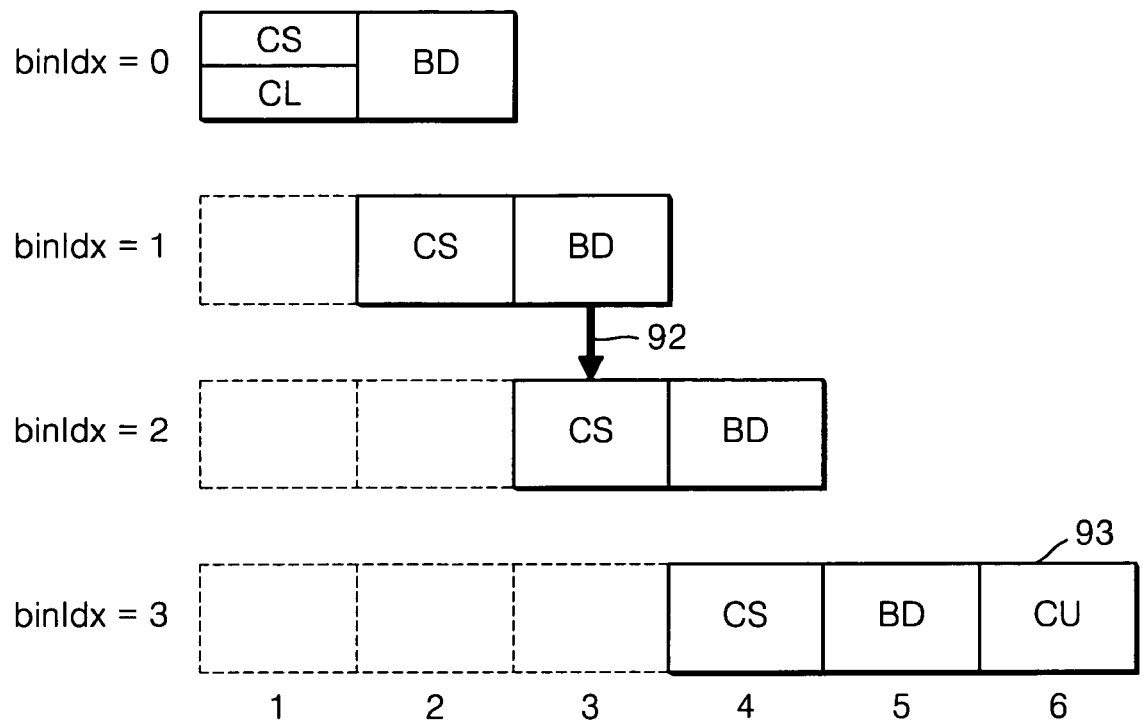
FIG. 7 show how a pipeline operates when a stall does not occur in the case of using a pipeline architecture, according to an exemplary embodiment of the present invention.

FIG. 7 show how a pipeline operates when a stall does not occur in the case of using a pipeline architecture, according to an exemplary embodiment of the present invention. Referring to FIG. 7, a decoding pipeline is shown for the first to fourth bins.

In the first cycle, the CS and CL operations are concurrently performed for the first bin (binIdx=0). The CL operation must not be skipped for the first bin.

In the second cycle, the BD operation is performed for the first bin (binIdx=0), while the CS operation is performed for the second bin (binIdx=1). As a result of the CS operation, if the context model required to decode the second bin (binIdx=1) is the same as the context model used to decode the first bin (binIdx=0), the CL operation is not required for the second bin (binIdx=1), since the required context model is already stored in the CMR.

In the third cycle, the BD operation is performed for the second bin (binIdx=1), while the CS operation is performed for the third bin (binIdx=2). As a result of the CS operation, if the context model required to decode the third bin (binIdx=2) is the same as the context model used to decode the second bin (binIdx=1), the CL operation is not required for the third bin (binIdx=2), since the required context model is already stored in the CMR.

In the CS operation for the third bin (binIdx=2) shown in FIG. 7, the second bin is used, which shows a data dependency 92. As described above, in the decoding device of the present invention, during the CS operation for the third bin (binIdx=2), context indexes of the context model for the third bin are respectively estimated for the cases of when the decoded value of the second bin (binIdx=1) is 0 and 1. When the decoding is complete for the second bin in the same cycle, one of the estimated context indexes are selected. The context index is selected by the 2:1 multiplexer, resulting in a simple implementation. Further, the stall can be prevented since the context index can be simply selected in the same cycle.

In the fourth cycle, the BD operation is performed for the third bin (binIdx=2), while the CS operation is performed for the fourth bin (blinIdx=3). As a result of the CS operation, if the context model required to decode the fourth bin (blinIdx=3) is the same as the context model used to decode the third bin (binIdx=2), the CL operation is no longer required for the third bin (binIdx=2), since the required context model is already stored in the CMR.

In the fifth cycle, the BD operation is performed for the fourth bin (blinIdx=3), and in the sixth cycle, the CU operation 93 is performed for the fourth bin (blinIdx=3).

As shown in FIG. 7, when there is no stall in the CL and CU operations, the structural hazard does not occur, resulting in better pipeline operation. Therefore, the latency can be reduced when all of the bins are decoded.

Figure 8:
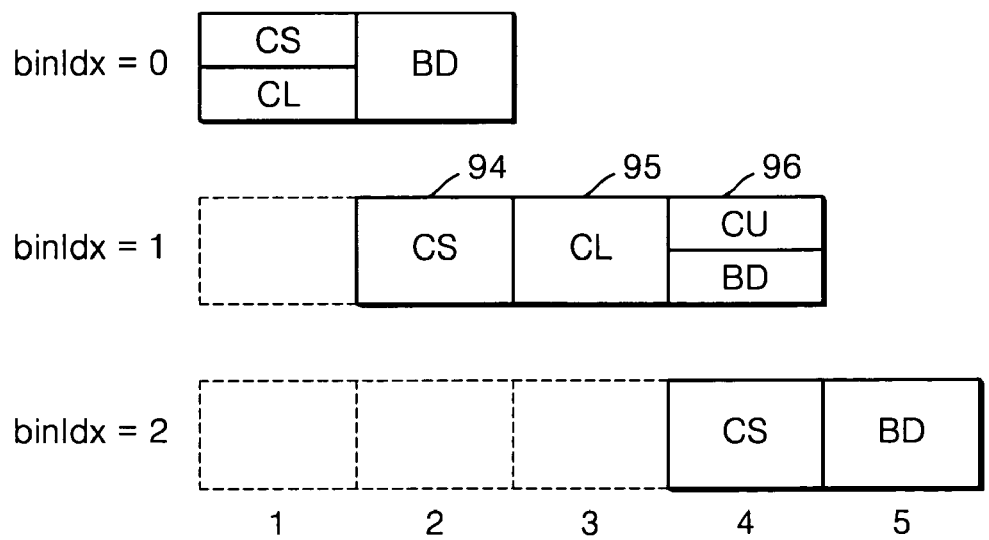
FIG. 8 show how a pipeline operates when a stall does not occur in the case of using a pipeline architecture, according to an exemplary embodiment of the present invention.

FIG. 8 show how a pipeline operates when a stall does not occur in the case of using a pipeline architecture, according to an exemplary embodiment of the present invention. Referring to FIG. 8, a decoding pipeline is shown for the first to third bins.

Referring to FIG. 8, in the CS operation 94 for the second bin (binIdx=1), the context model required to decode the second bin (binIdx=1) differs from the context model used to decode the first bin (binIdx=0). To read the context model for the second bin, the CL operation 95 is performed for the second bin in the third cycle.

In the fourth cycle, during the BD operation for the second bin, the CU operation 96 is performed for the modified context model. Further, the CS operation is performed for the third bin (binIdx=2) in the same cycle.

As shown in FIG. 8, in the decoding method of the present invention, when a new context model is read from the memory, the CL operation is performed first. Then, during the BD operation or the CS operation which does not require memory access, the CU operation is performed to store the modified context model in the memory.

Comparing FIG. 8 with FIG. 7, the BD operation for the third bin is performed in the fourth cycle in FIG. 7 and is performed in the fifth cycle in FIG. 8. It shows that only a one-cycle stall occurs in the CL operation.

In comparison, in FIG. 5, the BD operation for the third bin is performed in the sixth cycle.

In the decoding method of the present invention, the pipeline operation is delayed much less than in the method not using the pipeline architecture. Thus, the pipeline operation performs better, thereby significantly reducing the decoding time.

The BSB unit 330 provides a codeword 89 which is used in the DB unit 320. When the BSB is empty, a three-cycle stall occurs, filling the BSB. As described above, this stall is not preventable.

Figures 9, 10:
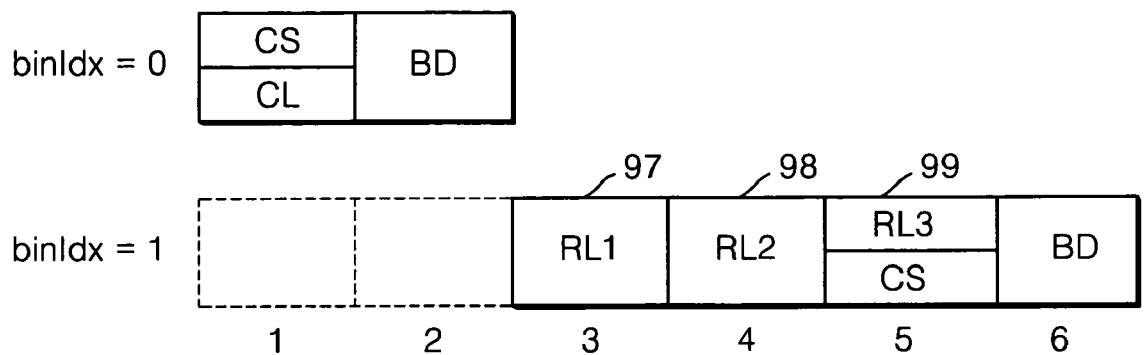
FIG. 9 shows a pipeline operation when a stall occurs due to an empty bit stream buffer.
FIG. 10 is a table comparing the performance of CABAC decoders with and without the pipeline architecture of the present invention.

FIG. 9 shows a pipeline operation when a stall occurs due to an empty BSB. Referring to FIG. 9, the stall occurs to fill the empty BSB in the third to fifth cycles. An RL1 97, RL2 98, and an RL3 99 are bit stream reloading operations.

In the fifth cycle, the CS operation for the second bin (binIdx=1) is performed, which shows that a three cycle stall occurs.

FIG. 10 is a table comparing the performance of CABAC decoders with and without the pipeline architecture of the present invention. Referring to the table of FIG. 10, the column of "No pipeline" shows the number of cycles when not using the pipeline architecture, and the column of "Pipeline" shows the number of cycles when using the pipeline architecture.

Referring to FIG. 10, in the first example (salesman) of processing 81 frames, the number of cycles is reduced by 7.8% when using the pipeline architecture of the present invention. In the second example (foreman) and the third example (silent), the number of cycles is reduced by 10.7% and 8.7%, respectively.

Therefore, in the method and device for decoding a plurality of bin values in the CABAC decoder using the pipeline architecture, context models are stored in the CMR until no longer used, thereby preventing stalls due to the structural hazard caused by the CL and CU operations. Further, stalls caused by data dependency are prevented by using data forwarding. Therefore, the pipeline operation is delayed much less and performs better, which leads to a reduction of the number of cycles and time required for the overall decoding.

The invention can also be embodied as computer readable code on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the internet).

While the present invention has been particularly shown and described with reference to exemplary embodiments thereof, it will be understood by those skilled in the art that various changes in form and detail may be made therein without departing from the spirit and scope of the present invention as defined by the appended claims.

What is claimed is:

1. A method of decoding a plurality of bin values in a context-based adaptive binary arithmetic coding decoder using a pipeline architecture, the method comprising:
   reading a first context model required to decode a first bin value, from a memory;
   determining whether a second context model required to decode a second bin value is the same as the first context model, while decoding the first bin value using the first context model;
   determining whether a third context model required to decode a third bin value is the same as the second context model, while decoding the second bin value using the second context model, if it is determined that the second context model is the same as the first context model; and
   reading the second context model from the memory, if it is determined that the second context model is not the same as the first context model.

2. The method of claim 1, wherein the reading the first context model from a memory comprises:
   reading candidate context models corresponding to a syntax element including the first bin value from the memory while calculating a context index increment for the syntax element including the first bin value; and
   selecting one of the candidate context models using the calculated context index increment.

3. The method of claim 2, wherein the reading the candidate context models comprises reading the candidate context models by using a context index offset which is determined according to a type of the syntax element including the first bin value.

4. The method of claim 1, wherein the determining whether the second context model is the same as the first context model comprises:
   calculating a context index for a syntax element including the second bin value; and
   determining whether the second context model is the same as the first context model according to whether a context index for the first context model is the same as the calculated context index.

5. The method of claim 1, further comprising storing the first context model, which is modified when the first bin value is decoded, in the memory while decoding the second bin value using the second context model, if it is determined that the second context model is not the same as the first context model.

6. The method of claim 5, wherein the determining whether the third context model required to decode the third bin value is the same as the second context model is performed while decoding the second bin value and storing the first context model in the memory, if the second context model is not the same as the first context model.

7. The method of claim 1, wherein the determining whether the second context model is the same as the first context model comprises:
- estimating context indexes of the second context model for each case when the first bin value is 0 and 1 while decoding the first bin value using the first context model;
- selecting one of the estimated context indexes according to the decoded bin value; and
- determining whether the second context model is the same as the first context mode according to whether the selected context index is the same as the context index of the first context model.

8. The method of claim 7, wherein the selecting the one of the estimated context indexes according to the decoded bin value comprises selecting one of the estimated context indexes using a 2:1 multiplexer.

9. A method of decoding a plurality of bin values in a context-based adaptive binary arithmetic coding decoder using a pipeline architecture, the method comprising:
- determining whether a first context model read from a memory is the same as a second context model required to decode an (i)th bin value, where i is a positive integer;
- determining whether a third context model required to decode an (i+1)th bin value is the same as the second context model while decoding the (i)th bin value using the second context model, if it is determined that the first context model is the same as the second context model; and
- reading the second context model from the memory, if it is determined that the first context model is not the same as the second context model.

10. The method of claim 9, wherein the determining whether the third context model required to decode the (i+1)th bin value is the same as the second context model, comprises:
- calculating a context index for a syntax element including the (i+1)th bin value; and
- determining whether the third context model is the same as the second context model according to whether the context index for the second context model is the same as the calculated context index.

11. The method of claim 9, further comprising storing the first context model in the memory while decoding the (i)th bin value using the second context model, if it is determined that the first context model is not the same as the second context model.

12. The method of claim 9, wherein the determining whether a third context model required to decode the (i+1)th bin value is the same as the second context model comprises:
- estimating context indexes of the third context model for each case when the (i)th bin value is 0 and 1 while decoding the (i)th bin value using the second context model;
- selecting one of the estimated context indexes according to the decoded (i)th bin value; and
- determining whether the third context model is the same as the second context mode according to whether the selected context index is the same as the context index of the second context model.

13. The method of claim 12, wherein the selecting the one of the estimated context indexes according to the decoded (i)th bin value comprises selecting the one of the estimated context indexes using a 2:1 multiplexer.

14. A device for decoding a plurality of bin values using a pipeline architecture, the device comprising:
- a context model loading unit which reads a first context model required to decode a bin value;
- a decoding and context model equality determining unit which determines whether a second context model required to decode a next bin value in a pipeline is the same as the first context model while decoding the bin value using the first context model; and
- a pipeline control unit which operates the decoding and context model equality determining unit by considering the next bin value in the pipeline to be the current bin value in the pipeline if the second context model is the same as the first context model, and operates the context model loading unit by considering the next bin value in the pipeline to be the current bin value in the pipeline if the second context model is not the same as the first context model.

15. The device of claim 14, wherein the context model loading unit comprises:
- a context index increment calculating and candidate context model loading unit which reads candidate context models corresponding to a syntax element including the bin value from the memory while calculating a context index increment for the syntax element including the bin value; and
- a context model selection unit which selects one of the candidate context models using the calculated context index increment.

16. The device of claim 15, wherein the context index increment calculating and candidate context model loading unit reads the candidate context models by using a context index offset which is determined according to a type of the syntax element including the bin value.

17. The device of claim 14, wherein the decoding and context model equality determining unit comprises:
- a context index calculating unit which calculates a context index for a syntax element including the next bin value in the pipeline; and
- a context model determining unit which determines whether the second context model is the same as the first context model according to whether a context index for the first context model is the same as the calculated context index.

18. The device of claim 14, further comprising a decoding and context model update unit which stores the first context model in the memory while decoding the next bin value in the pipeline using the second context model, if the second context model is not the same as the first context model.

19. The device of claim 18, wherein the decoding and context model update unit determines whether the third context model required to decode the next to the next bin value in the pipeline is the same as the second context model while decoding the next bin value in the pipeline and storing the first context model in the memory.

20. The device of claim 14, wherein the decoding and context model equality determining unit comprises:
- a decoding and context index estimating unit which estimates context indexes of the second context model for each case when the bin value to be decoded is 0 and 1 while decoding the bin value using the first context model;
- a context index selection unit which selects one of the estimated context indexes according to the decoded bin value; and
- a context index comparing unit which determines whether the second context model is the same as the first context model according to whether the selected context index is the same as the context index of the first context model.

21. The device of claim 20, wherein the context index selection unit comprises a 2:1 multiplexer which selects the one of the estimated context indexes according to the decoded bin value.

22. A computer-readable medium having embodied thereon a computer program for executing a method of decoding a plurality of bin values in a context-based adaptive binary arithmetic coding decoder using a pipeline architecture, the method comprising:

reading a first context model required to decode a first bin value;

determining whether a second context model required to decode a second bin value in a pipeline is the same as the first context model while decoding the first bin value using the first context model;

determining whether a third context model required to decode a third bin value is the same as the second context model while decoding the second bin value using the second context model, if it is determined that the second context model is the same as the first context model; and reading the second context model, if it is determined that the second context model is not the same as the first context model.

23. A computer-readable medium having embodied thereon a computer program for executing a method of decoding a plurality of bin values in a context-based adaptive binary arithmetic coding decoder using a pipeline architecture, the method comprising:

determining whether a first context model read from a memory is the same as a second context model required to decode an (i)th bin value, where i is a positive integer;

determining whether a third context model required to decode an (i+1)th bin value is the same as the second context model while decoding the (i)th bin value using the second context model, if it is determined that the first context model is the same as the second context model; and reading the second context model from the memory, if it is determined that the first context model is not the same as the second context model.

* * * * *